US012696405B2

(12) United States Patent
Akin-Sodipo et al.

(10) Patent No.: US 12,696,405 B2
(45) Date of Patent: Jul. 28, 2026

(54) FLEXIBLE HINGED DEVICE

(71) Applicant: Microsoft Technology Licensing, LLC, Redmond, WA (US)

(72) Inventors: Oluwatomi Osamuede Akin-Sodipo, Seattle, WA (US); Brian D. Bitz, Woodinville, WA (US); Nicholas Wendt, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 39 days.

(21) Appl. No.: 18/674,706

(22) Filed: May 24, 2024

(65) Prior Publication Data

US 2025/0365877 A1      Nov. 27, 2025

(51) Int. Cl.
*H05K 5/02*      (2006.01)

(52) U.S. Cl.
CPC .................................. *H05K 5/0226* (2013.01)

(58) Field of Classification Search
None
See application file for complete search history.

(56) References Cited

U.S. PATENT DOCUMENTS

| | | | |
|---|---|---|---|
| 6,762,929 B2 | 7/2004 | Sawyer | |
| 7,032,984 B2 * | 4/2006 | Kim | G09F 9/30 |
| | | | 49/383 |
| 8,498,100 B1 | 7/2013 | Whitt, III et al. | |
| 9,632,541 B2 * | 4/2017 | Xin | G06F 1/1681 |

| | | | |
|---|---|---|---|
| 10,104,787 B2 | 10/2018 | Rothkopf et al. | |
| 10,683,591 B1 | 6/2020 | Podhajny et al. | |
| 11,016,529 B1 | 5/2021 | Tucker | |
| 11,169,579 B2 | 11/2021 | Peng | |
| 11,360,522 B2 | 6/2022 | Ho | |
| 11,474,569 B2 | 10/2022 | Huang | |
| 11,758,672 B2 | 9/2023 | Morino | |
| 11,914,432 B2 | 2/2024 | Wang | |
| 11,917,780 B2 | 2/2024 | Caplow-Munro | |
| 12,164,335 B2 | 12/2024 | Wu | |
| 12,309,306 B2 | 5/2025 | Lee | |
| 12,346,165 B2 | 7/2025 | Liu | |
| 12,355,908 B2 | 7/2025 | Jung | |
| 12,368,794 B2 | 7/2025 | Chen | |
| 2009/0079132 A1 | 3/2009 | Kramer | |
| 2013/0250492 A1 * | 9/2013 | Wong | G06F 1/1641 |
| | | | 361/679.01 |

(Continued)

FOREIGN PATENT DOCUMENTS

WO      2014088617 A2      6/2014

OTHER PUBLICATIONS

International Search Report and Written Opinion received for PCT Application No. PCT/US2024/055812, Jan. 30, 2025, 17 pages.

(Continued)

*Primary Examiner* — James Wu
*Assistant Examiner* — Christopher L Augustin
(74) *Attorney, Agent, or Firm* — Rainier Patents, P.S.

(57)      ABSTRACT

This patent relates to hinged devices, such as computing devices. One example includes a first portion and a second portion. A compliant mechanism is positioned in the first portion and includes a pair of bell cranks coupled by a cross-member. A flexible hinge has opposing sides of a first end secured to the pair of bell cranks and a second end secured to the second portion.

20 Claims, 17 Drawing Sheets

(56)     References Cited

U.S. PATENT DOCUMENTS

| | | | |
|---|---|---|---|
| 2016/0306396 A1 | 10/2016 | Bathiche | |
| 2017/0060180 A1* | 3/2017 | Griffin et al. | |
| 2017/0145724 A1* | 5/2017 | Siddiqui | G06F 1/1681 |
| 2017/0177038 A1* | 6/2017 | Whitt, III | G06F 1/1669 |
| 2017/0357287 A1 | 12/2017 | Yang | |
| 2018/0113493 A1 | 4/2018 | Silvanto | |
| 2019/0196544 A1* | 6/2019 | Mizoguchi | G06F 1/1652 |
| 2020/0241604 A1 | 7/2020 | Nakamura | |
| 2021/0278882 A1 | 9/2021 | Li | |
| 2022/0408573 A1 | 12/2022 | Jo | |
| 2023/0088731 A1* | 3/2023 | Bitz | H04M 1/0216 |
| | | | 361/679.28 |
| 2025/0208663 A1 | 6/2025 | Akin-Sodipo | |

OTHER PUBLICATIONS

Non-Final Office Action mailed on Aug. 21, 2025, in U.S. Appl. No. 18/393,315, 15 pages.

Final Office Action mailed on Mar. 23, 2026, in U.S. Appl. No. 18/393,315, 18 pages.

* cited by examiner

Device 100

Hinge assembly 106

First hinge end 108

Second hinge end 112

Flexible hinge 128

Second surface 122

First portion 102

Slot 202

Coupler 130

First hinge end 108

Second hinge end 112

Second distal end 114

Second portion 104

First distal end 110

FIG. 2A

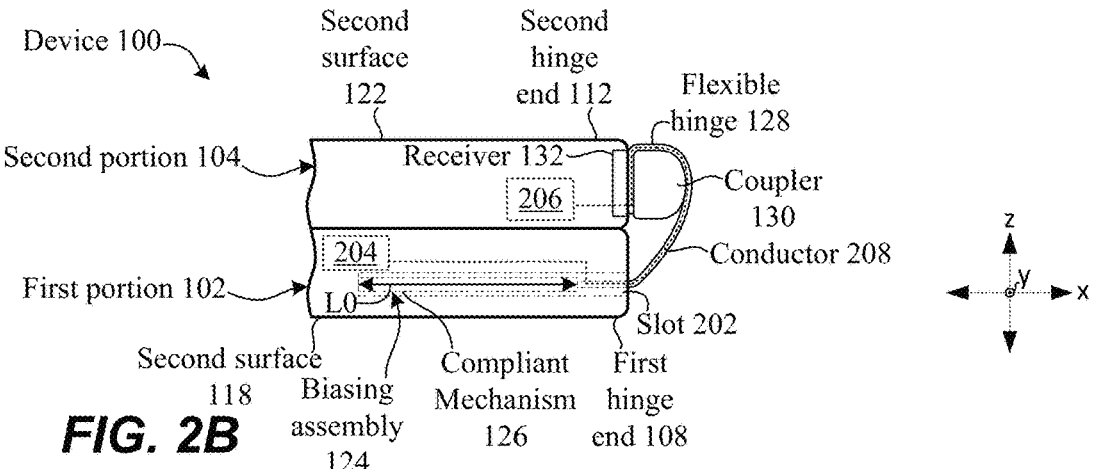

Device 100

Second surface 122

Second hinge end 112

Flexible hinge 128

Second portion 104

Receiver 132

Coupler 130

206

Conductor 208

First portion 102

204

L0

Slot 202

Second surface 118

Biasing assembly 124

Compliant Mechanism 126

First hinge end 108

FIG. 2B

Device 100

Second portion 104

Hinge assembly 106

First surface 120

First surface 116

First portion 102

Coupler 130 z x y

Second hinge end 112

Device 100

First surface 116

Coupler 130

First portion 102

L220

Receiver 132

Second portion 104 z y x

Biasing assembly 124

Compliant Mechanism 126

Slot 202

Flexible Hinge 128

First surface 120

Device 100

First portion 102

Second portion 104

First surface 116

Hinge assembly 106

Coupler 130

Device 100

First surface 116

Biasing assembly 124

Compliant Mechanism 126

Slot 202

First portion 102

L360

Second portion 104

Flexible hinge 128

Coupler 130

Receiver 132

Second hinge end 112

First surface 120

Cover 604

Frame 602

Pivot aperture 620(2)

Compliant mechanism 126B

Pivot aperture 620(1)

Bell crank 606(2)

Hinge aperture 622(2)

Flexure 612

Distal end 616

Cross-member 608(1)

Proximal end 614

Flexure 612

Pivot shaft 618(2)

Bell Crank 606(1)

Central Portion 610

Flexure 612

EHLR

Flexible Hinge 128

Cross-member 608(2)

Hinge shaft 624(2)

Hinge width

EHLL

First portion 102

FLEXIBLE HINGED DEVICE

BACKGROUND

Many computer form-factors, such as smart phones, tablets, and notebook computers can provide enhanced functionality by folding for storage and opening for use and/or by folding into various configurations. For instance, the folded device is easier to carry and the opened device offers more input/output area.

SUMMARY

This patent relates to hinged devices, such as computing devices. One example includes a first portion including a compliant mechanism. The example also includes a second portion and a flexible hinge secured between the second portion and the compliant mechanism. The compliant mechanism includes a pair of bell cracks interconnected by a cross-member.

This example is intended to provide a summary of some of the described concepts and is not intended to be inclusive or limiting.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Note that some figures illustrate many elements and adding lead lines and designators to all of the elements can diminish readability of the figure. Accordingly, not every element is designated in every figure.

FIGS. 1A, 1B, 1C, 2A, 3A, 4A, 5A, 6B, 7B, and 8B show perspective views of example devices in accordance with some implementations of the present concepts.

FIGS. 2B, 3B, 4B, 5B, 6C, 7C, 7D and 8C show elevational views of example devices in accordance with some implementations of the present concepts.

DESCRIPTION

The present concepts relate to devices, such as computing devices employing flexible hinges that are biased toward a retracted position but can be extended when subjected to an external force. Flexible hinges have been employed before to rotationally couple device portions through a range of angular orientations. However, a length of a path of the flexible hinge changes with different angular orientations. As result, traditional flexible hinges were long enough to accommodate the longest path length associated with the any of the angular orientations. This resulted in extra flexible hinge length (e.g., material) at other angular orientations. This extra flexible hinge material can diminish device function. For instance, the extra flexible hinge material can obscure portions of the device. Alternatively or additionally, the extra flexible hinge material makes typing very unstable at some device orientations and/or use case scenarios. In contrast, the present concepts provide a flexible hinge that is internally biased (e.g., retracted) into the first portion to ensure there is no extra hinge material between the first and second portions of the device. As the angular orientation changes, external forces created by the hinge ends of the device portions can overcome the internal bias force to pull out sufficient hinge material. The internal bias continues to be exerted on the flexible hinge material and can retract additional hinge material as dictated by the pathlength defined by the angular orientation of the first and second portions.

The present concepts provide a technical solution that ensures that extra flexible hinge length does not diminish the user experience, such as by blocking portions of the display. This technical solution ensures that the length of the exposed portion of the flexible hinge matches the pathlength between the first and second portions. The remainder of the flexible hinge is biased into the first portion of the device. This technical solution can enhance use of the device real estate, such as by allowing a smaller bezel and hence a larger display because extra hinge material that could block the display is eliminated. This technical solution also ensures that the length of the exposed portion of the flexible hinge is the same across the hinge length (e.g., the same on the left side as the right side). These and other aspects are described below.

Figure 1A:
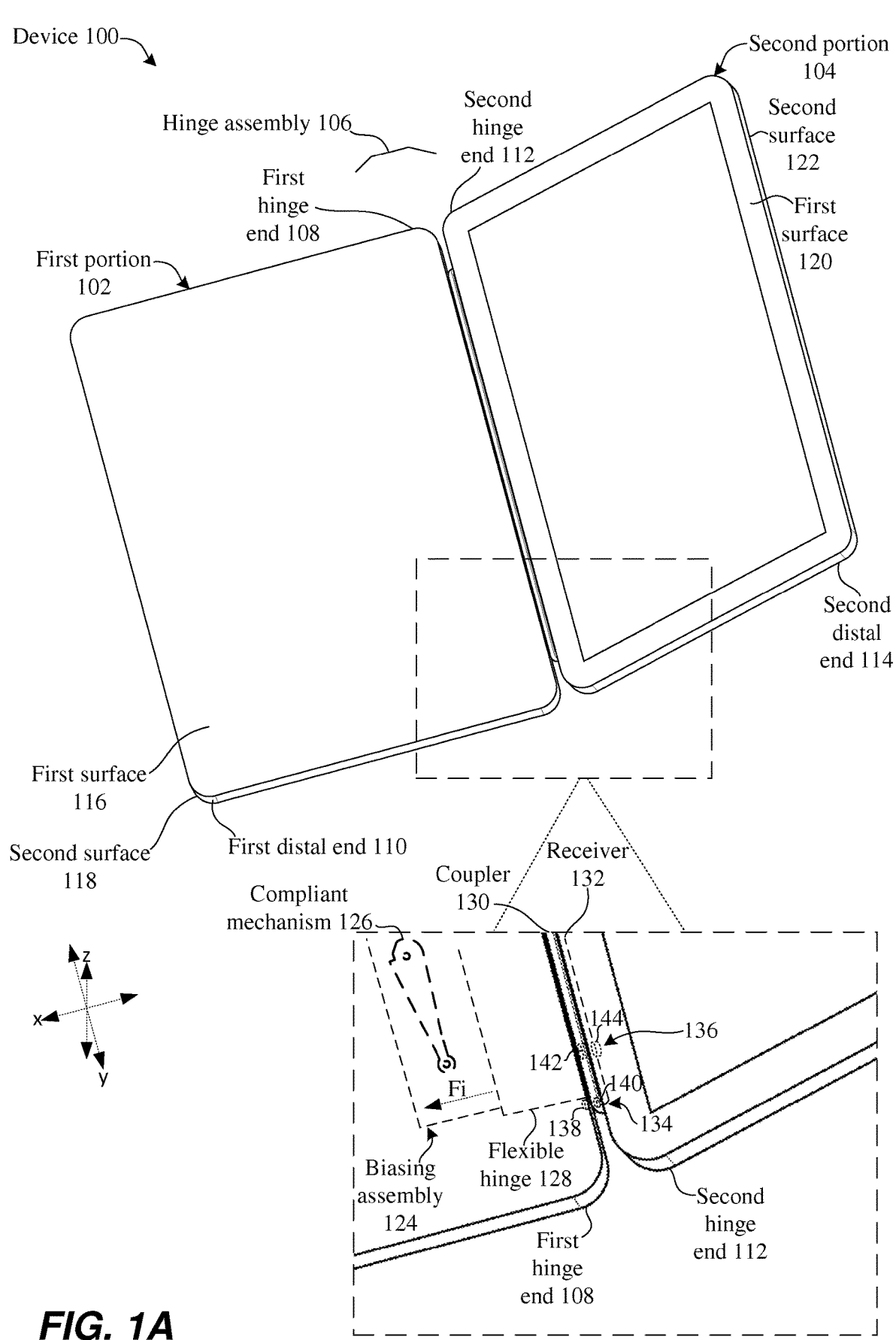
Figure 1B:
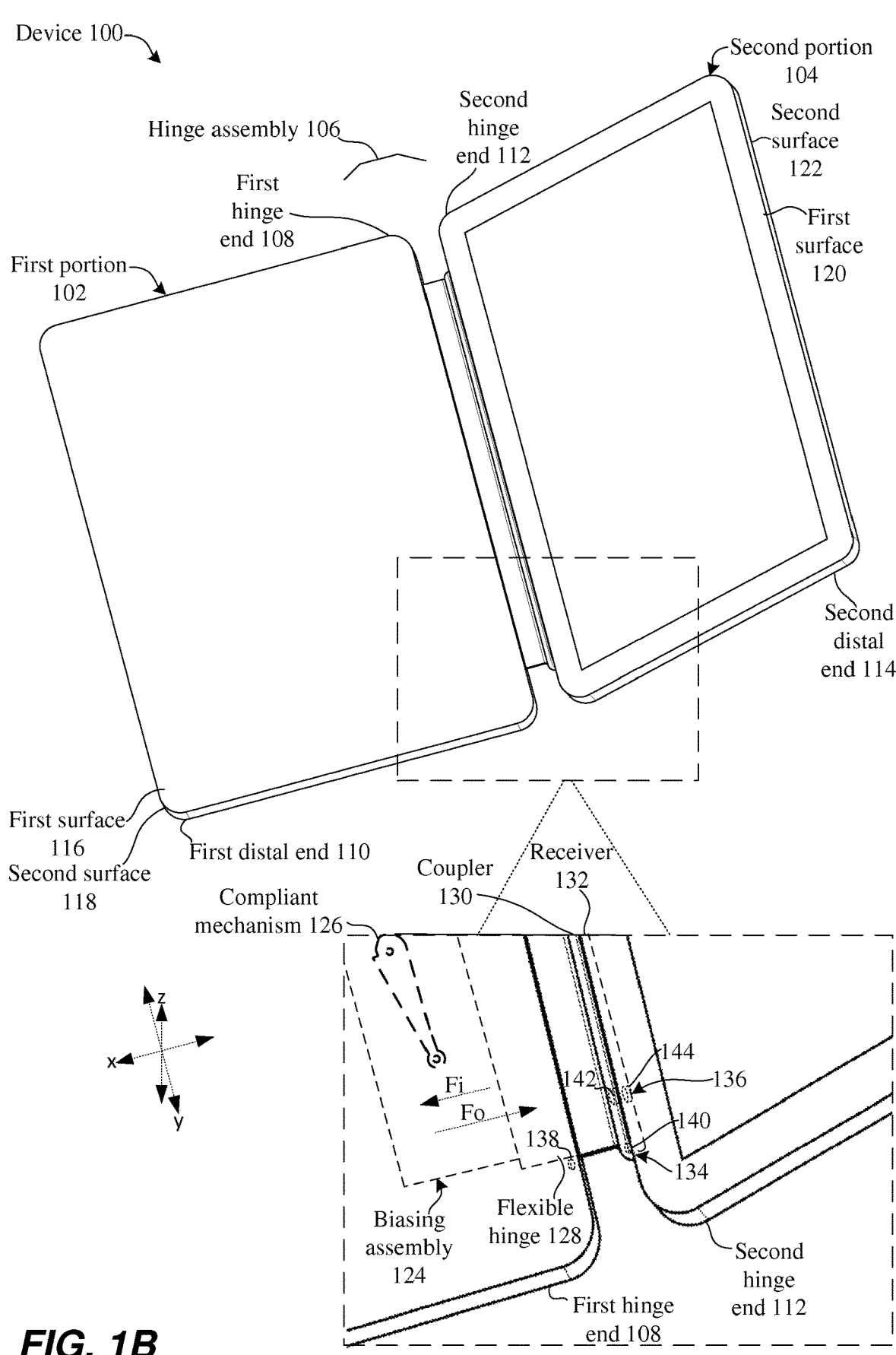
Figure 1C:
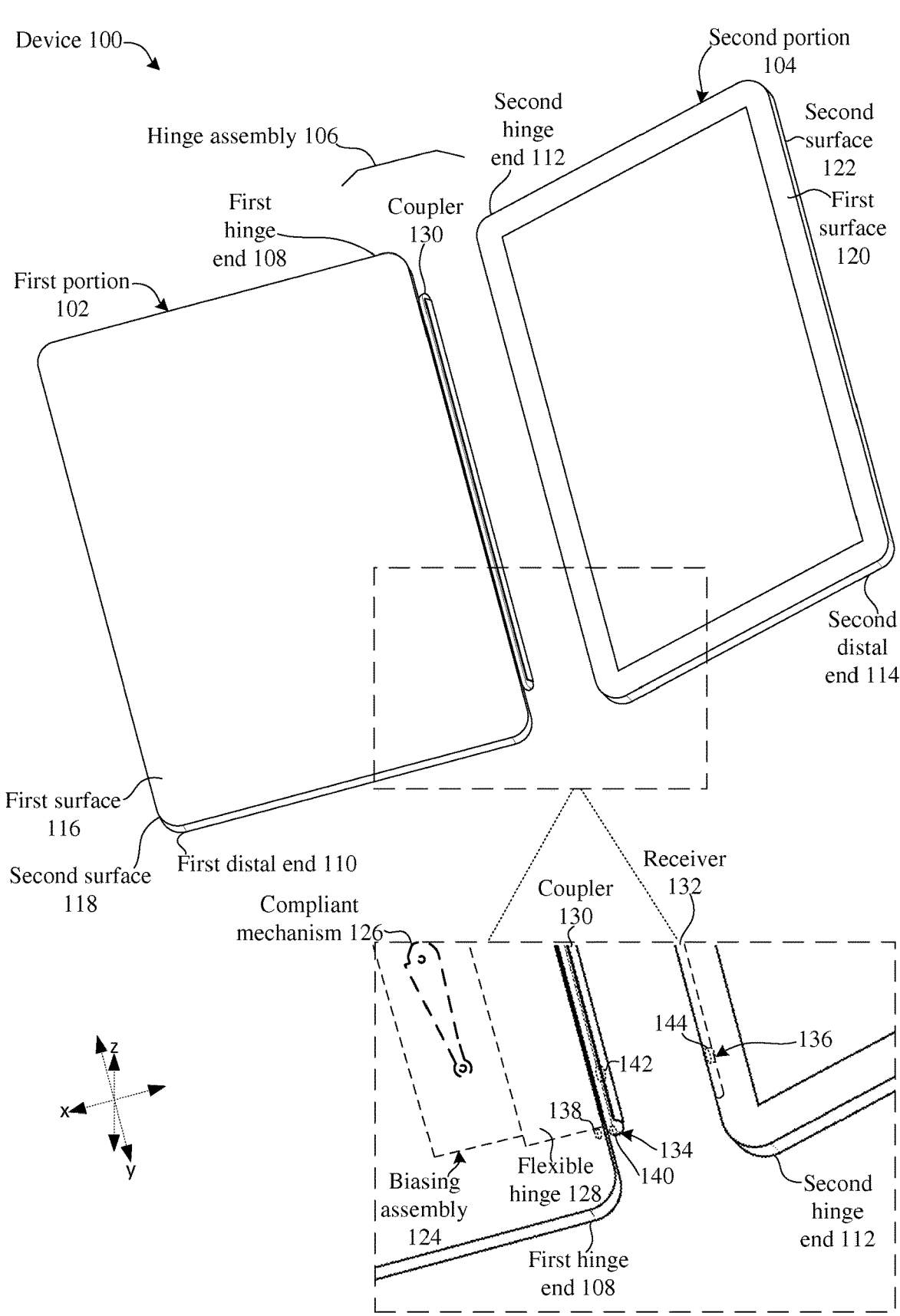

Introductory FIGS. 1A-1C collectively show an example device 100 that includes first and second portions 102 and 104 that are coupled by a hinge assembly 106. The hinge assembly 106 allows the first and second portions to rotate relative to one another through a range of angular orientations, such as from a closed angular orientation to a fully opened angular orientation. The first portion 102 can include a first hinge end 108 and a first distal end 110. Similarly, the second portion 104 can include a second hinge end 112 and a second distal end 114. The first portion 102 defines opposing spaced-apart first and second surfaces 116 and 118 and the second portion 104 defines opposing spaced-apart first and second surfaces 120 and 122. To avoid confusion, first surface 120 could also be viewed as the "third surface" and second surface 122 could be viewed as the "fourth surface."

The hinge assembly 106 includes a biasing assembly 124 that includes a compliant mechanism 126. The biasing assembly 124 acts on a flexible hinge 128. The flexible hinge 128 terminates in a coupler 130 that removably engages a receiver 132 defined by the second portion 104. The biasing assembly 124 is positioned between the first and second surfaces 116 and 118. The biasing assembly 124 is secured to the flexible hinge 128 and to the first portion 102. The flexible hinge 128 is positioned between the first and second surfaces 116 and 118 and extends out of the first hinge end 108 and terminates at the coupler 130, which is outside (e.g., external to) the first portion 102. The flexible hinge 128 can extend along a majority of the first hinge end 108 of the first portion as measured in the y reference direction. In some of these implementations, the flexible hinge extends along about 75% to 100% of the first hinge end 108 (e.g., a width of the flexible hinge is slightly less than a width of the first hinge end 108 of the first portion 102). Bending of the flexible hinge 128 occurs parallel to the y reference axis. The flexible hinge may not have a fixed hinge axis synonymous with a traditional hinge but flexing and bending (e.g., hinge axes) are parallel to the y reference axis).

The compliant mechanism 126 provides a technical solution that maintains uniformity in the amount or length of flexible hinge material that is extended along its width.

Stated another way, the compliant mechanism 126 ensures that as the flexible hinge moves in and out of the first portion (in the x reference direction) approximately the same amount of flexible hinge material extends from side to side (e.g., the amount on the left side is approximately equal to the amount on the right side as viewed along the width of the flexible hinge material (e.g., along the hinge axis or y reference axis)). In this case 'approximately' means+/–5% or less.

In some implementations, the device 100 also includes a stability mechanism 134 and a retention mechanism 136. In this example, the stability mechanism 134 is manifest as pairs of magnets 138 and 140 positioned on the distal ends of the first hinge end 108 and the coupler 130. The pairs of magnets 138 and 140 align the coupler 130 with the first hinge end 108. The alignment can maintain the coupler 130 between the first and second surfaces 116 and 118 of the first portion 102 when the first and second portions 102 and 104 are physically separated from one another as shown in FIG. 1C. This maintenance of the coupler 130 can facilitate recoupling the first and second portions by holding the coupler 130 against the first hinge end 108 of the first portion 102 and pointing outward to facilitate coupling with the receiver 132 when the first and second portions are positioned proximate to one another by the user.

When the first and second portions 102 and 104 are coupled together by the coupler 130 and the receiver 132, the pairs of magnets 138 and 140 can prevent relative movement of the first hinge end 108 of the first portion relative to the coupler 130 and the second portion 104. For instance, such movement can include side-to-side rocking when the user is engaging the first portion, such as when the user is typing on the first portion. This relative movement can also include deformation of portions of the hinge end when engaged by a user. Stated another way, deformation of the first hinge end from forces associated with user engagement is reduced by the stability mechanism 134 and/or the retention mechanism 136. For instance, if the first portion 102 and the first hinge end 108 have a generally planar configuration, the stability mechanism 134 and the retention mechanism 136 reduce deformation from the planar configuration when the user engages the device 100, such as by holding the device and/or typing on the device.

The retention mechanism 136 is manifest as pairs of magnets 142 and 144 positioned in the coupler 130 and the receiver 132, respectively. The pairs of magnets 142 and 144 can draw the coupler and receiver together and provide precise alignment and mechanical coupling as the user positions them toward one another. Once engaged, the pairs of magnets 142 and 144 can provide a retention force between the coupler 130 and receiver 132 (e.g., mechanical coupling) so that they do not come apart unless the user forcibly pulls them apart as shown in FIG. 1C. This retention force can work cooperatively with the stability offered by the stability mechanism 134 as a technical solution to create stability between the first portion 102, the hinge assembly 106, and the second portion 104 to enhance user engagement, such as carrying the device by holding only the first portion 102 or the second portion 104 or when engaging input devices on the first portion or the second portion.

The biasing assembly 124 imparts a bias force Fi on the flexible hinge 128 into the first portion (e.g., in the –x reference direction). As shown in FIG. 1A, under some conditions (e.g., at some angular orientations) the biasing force Fi (force inward) can pull the flexible hinge 128 into the first portion until the coupler 130 is against the first hinge end 108 of the first portion 102. At this point, the coupler 130 stops further movement of the flexible hinge 128 into the first portion 102.

FIG. 1B shows an outward force Fo overcoming the biasing force Fi to extend (e.g., pull) the flexible hinge 128 part way out of the first portion. Retention forces between the magnets 142 and 144 are large enough that as the device portions are separated, the coupler 130 stays engaged with the receiver 132 while the extent of the flexible hinge external to the first portion 102 increases (e.g., the flexible hinge 128 is extended). This extension can occur when a user pulls the first and second portions apart to separate them. This extension can also occur as the first and second portions are rotated to various angular orientations. The biasing assembly 124 provides a technical solution that creates biasing force Fi on the flexible hinge 128 from the first hinge end 108 toward the first distal end 110 and an extent of the flexible hinge exposed at the first hinge end 108 is determined by an angular orientation of the first and second portions. This aspect is described in more detail below relative to FIGS. 2A-5B.

FIG. 1C shows the first and second portions 102 and 104 separated from one another. This separation can occur when forces pulling the first and second portions apart, such as exerted by a user, are greater than the retention forces between the magnets 142 and 144 and the coupler 130 is separated from the receiver 132. Once separation occurs, the biasing force Fi biases the flexible hinge 128 back into the first portion until the coupler 130 contacts the first hinge end 108, which stops further inward movement.

Figures 3A, 3B:
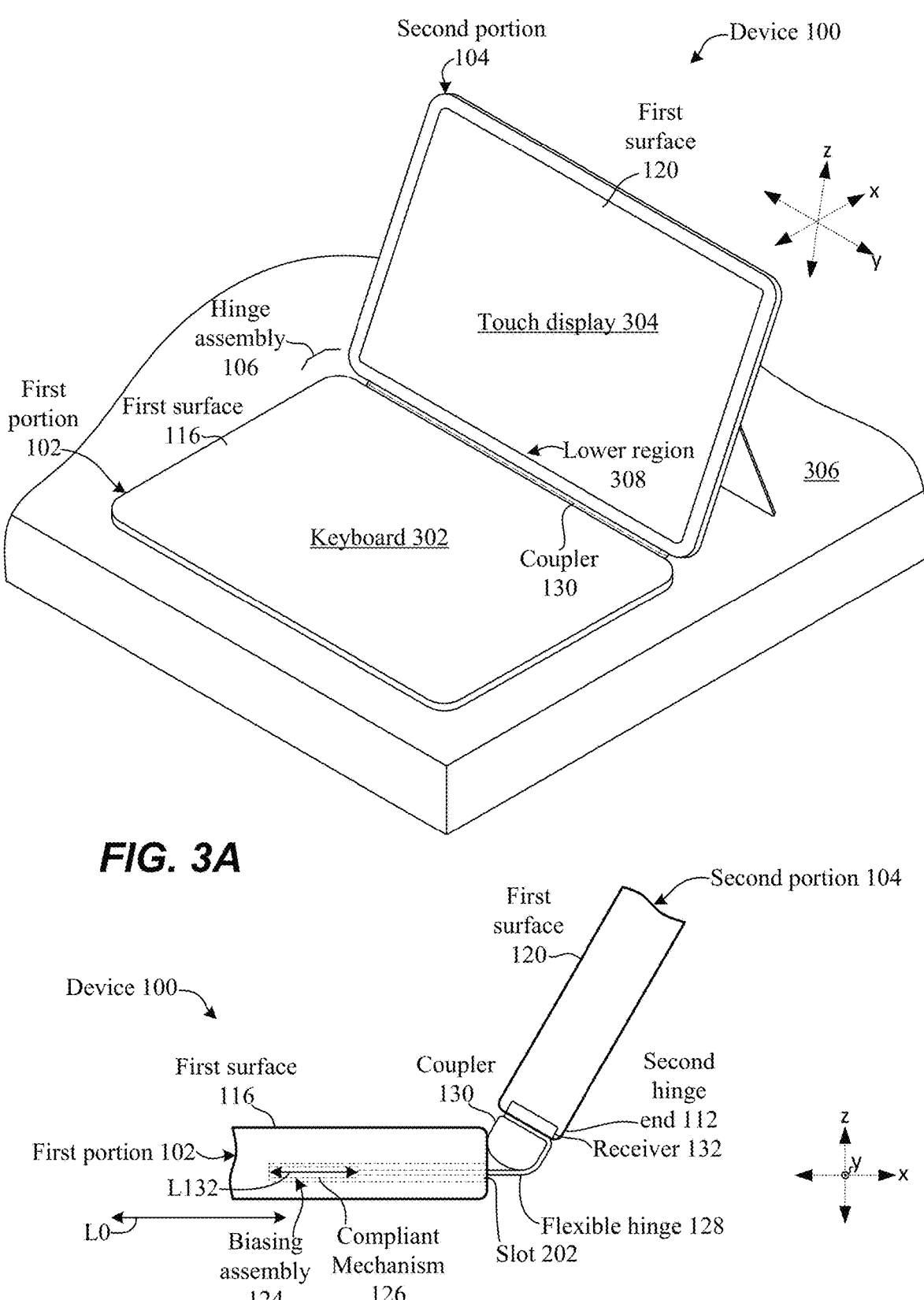
Figures 4A, 4B:
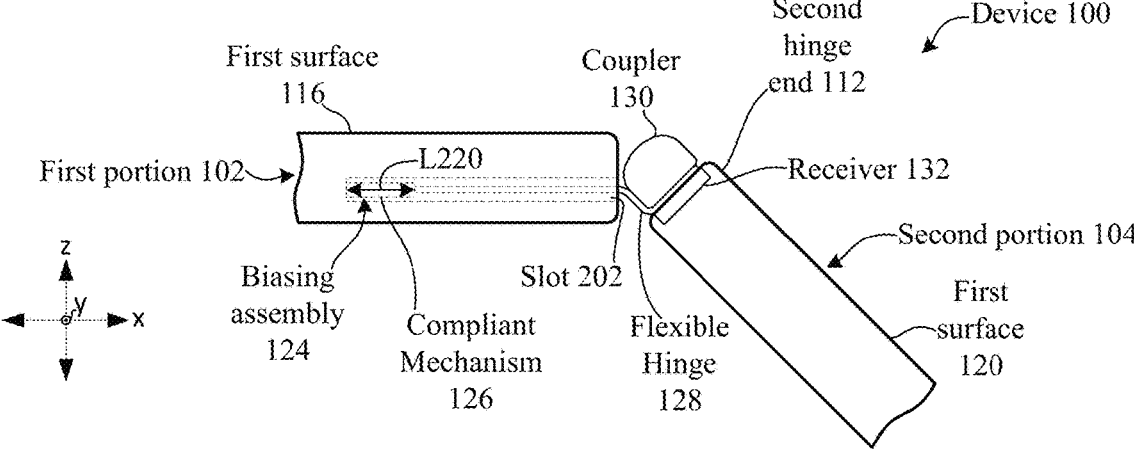
Figure 5A:
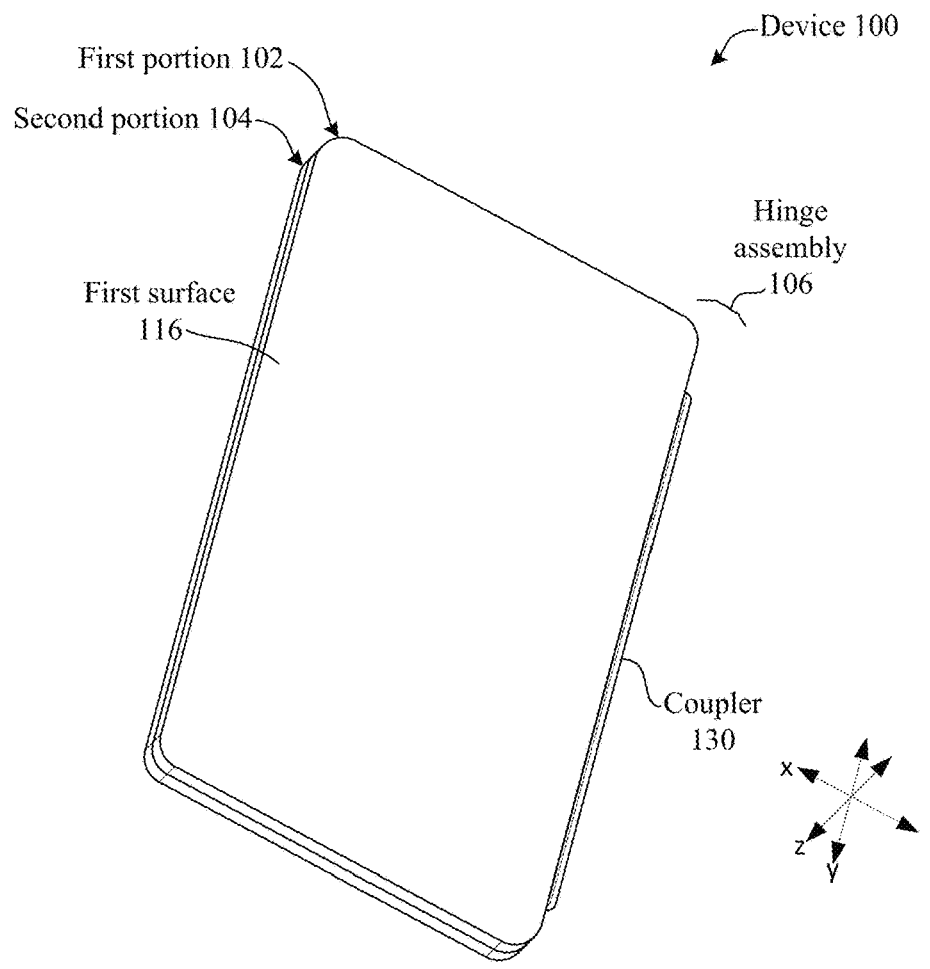
Figure 5B:
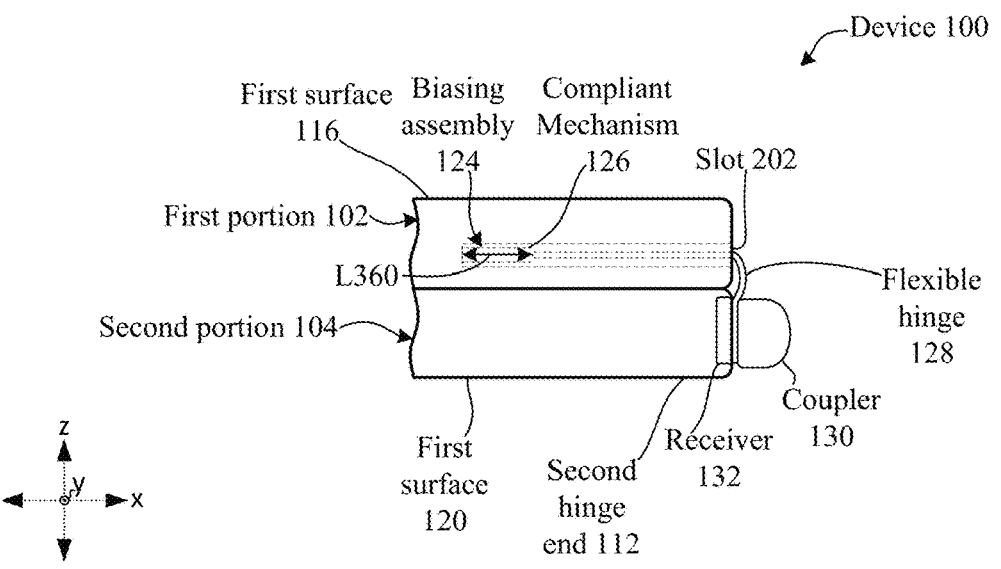

FIGS. 2A-5B collectively show additional features of example hinge assembly 106. FIGS. 2A and 2B show device 100 with the first and second portions positioned against one another in a zero-degree or closed angular orientation. FIGS. 3A and 3B show device 100 with the first and second portions positioned relative to one another in an approximately 132-degree angular orientation. FIGS. 4A and 4B show device 100 with the first and second portions positioned relative to another in an approximately 220-degree angular orientation. FIGS. 5A and 5B show device 100 with the first and second portions in a fully open angular orientation, which in this case entails an approximately 360-degree angular orientation.

These FIGS. show a slot 202 defined in the first hinge end 108 of the first portion 102. The flexible hinge 128 emerges from the slot 202 and terminates at coupler 130.

FIGS. 2A and 2B show the device with the first and second portions 102 and 104 closed against one another at a zero-degree angular orientation. In the zero-degree angular orientation, the first surfaces (116 and 120, labelled on FIG. 3A) are positioned against one another and the second surfaces 118 and 122 are facing away from one another. At this angular orientation, the path of the flexible hinge from the first portion to the second portion is relatively long. As a result, the bias force of the biasing assembly 124 on the flexible hinge 128 into the first portion 102 is partially overcome and a relatively larger proportion of the flexible hinge 128 is pulled out of the first portion (e.g., out of the slot 202) and is exposed at the hinge ends 108 and 112. This aspect can be visualized in that the length L0 of the biasing assembly 124 is greater at this angular orientation than at the other shown angular orientations. The longer length L0 allows more of the flexible hinge 128 to be extended or pulled out of the first portion and extend between the first and second portions. Note that the flexible hinge can be relatively inelastic and not stretch significantly during this process. Instead, the extent or percentage of the flexible hinge that is external to the first portion 102 is determined by the length L of the biasing assembly 124. Thus, the extent of the flexible hinge 128 that is external to the first portion is inversely proportional to the length L of the biasing assembly 124.

Note that the inward bias created by the biasing assembly 124, which in this case includes the compliant mechanism 126 maintains tension on the flexible hinge 128. Thus, no extra flexible hinge length is external to the first portion (e.g., exposed). Instead, the exposed portion of the flexible hinge 128 (e.g., that is external to the first portion) is equivalent to the path length of the flexible hinge at this angular orientation. As can be seen by comparing FIGS. 2B, 3B, 4B, and 5B as the pathlength of the flexible hinge changes with the angular orientation of the first and second portions, the length of the flexible hinge that is external to the first portion changes accordingly and no surplus flexible hinge material is outside the first portion at a particular angular orientation.

FIG. 2B also shows electronic components 204 and 206 positioned in the first and second portions 102 and 104, respectively. The flexible hinge 128 can include electrical conductors 208 that electrically couple the electronic components 204 and 206. The electrical conductors 208 can include removable junctions between the coupler 130 and the receiver 132. Thus, the coupler 130 and the receiver 132 provide both mechanical and electrical coupling between the first and second portions. The electronic components 204 and 206 and the electrical conductors 208 are not shown in the other FIGS. to reduce clutter on the drawing pages. However, the electronic components can include processors, batteries, and/or input/output devices 210. Example input/output devices 210 are shown on first surfaces 116 and 120 on FIG. 3A.

FIGS. 3A and 3B show the first and second portions 102 and 104 rotated to a common notebook style user angle of approximately 132 degrees. The input/output devices 210 are manifest as a keyboard 302 on first surface 116 and a touch display 304 on first surface 120. Other configurations are contemplated, such as displays, non-touch and/or touch, positioned on both first surfaces 116 and 120 and second surfaces 118 and 122, among other configurations.

Recall that the stability mechanism 134 described and illustrated relative to FIGS. 1A-1C biases the coupler 130 against the first portion 102. The stability mechanism 134 prevents or constrains movement (e.g., in the z reference direction) between the coupler 130 and the first portion 102 when the user engages the first portion, such as by using the keyboard 302. The constrained movement can include relative vertical movement (e.g., in the z reference direction), rotational movement along the x reference direction, and/or deformation (e.g., changes in the shape), among others, when the user engages the first portion.

FIG. 3A shows the device 100 positioned on a horizontal reference surface 306, such as a tabletop. In this case, the hinge assembly 106 employing the flexible hinge 128 and the biasing assembly 124 ensures that extra hinge material is not external to the first portion 102, instead, the biasing assembly 124, via the compliant mechanism 126, biases the flexible hinge 128 into the first portion until stopped by contact between the coupler 130 and the first hinge end 108. This configuration provides a technical solution that allows the entire length of the first portion 102 in the x reference direction (e.g., the entire second surface 118) to contact the horizontal reference surface 306. This configuration reduces bounce, flexing, and/or rotation of the first portion when engaged by the user. This aspect can be even more pronounced on uneven reference surfaces, such as if the user places the device on their lap (e.g., knees/thighs). The integrity provided by the biasing assembly 124 biasing the flexible hinge 128 into the first portion and the stability mechanism (134, FIGS. 1A-1C) stabilizing the coupler 130 relative to the first portion, decreases relative movement and enhances the user experience.

The integrity of this configuration maintains a planar configuration of the first portion 102. The bias or tension provided to the flexible hinge 128 by the biasing assembly 124 ensures that extra hinge material does not extend upwardly between the first and second portions 102 and 104. This extra material creates a floppy feeling when the user types on the keyboard and/or obscures lower regions 308 of the touch display 304 on the second portion 104. Thus, the present concepts provide a technical advantage over existing flexible hinge designs where extra hinge material is folded in certain angular orientations of the device. This folded hinge material can obscure lower region 308 of the second portion. For instance, in relation to touch display 304, the folding may block some of the pixels and/or require a wider bezel so that the display does not extend as close to the hinge assembly. The present concepts control the extent that the flexible hinge extends out of the first portion with an inward bias. This inward bias keeps the flexible hinge taut and eliminates hinge material folding and/or associated blockage of the display on the second portion by the flexible hinge.

FIGS. 4A and 4B show the first and second portions rotated further to about 220 degrees. At this point a majority of the flexible hinge is being pulled into the first portion 102 as the biasing assembly 124 shortens. This shortening is evident in that biasing assembly length L220 is less than length L132 of FIGS. 3A and 3B. Thus, the extent of the flexible hinge 128 that is external to the first portion 102 is reduced compared to the zero-degree orientation and the 132-degree orientation. This reduction ensures that only enough flexible hinge length is extended out of the first portion to match the hinge path.

FIGS. 5A and 5B show the first and second portions 102 and 104 rotated further to a 360-degree angular orientation. At this angular orientation, the first surfaces 116 and 120 are facing outwardly and the second surfaces 118 and 122 are positioned against one another. The biasing assembly 124 has contracted to length L360 which is similar to length L220 of FIGS. 4A and 4B and shorter than lengths L132 and L0. Thus, the extent of flexible hinge 128 that is external to the first portion 102 is less than at the zero-degree and 132-degree orientations. At the 220-degree and 360-degree orientations, the exposed percentage of the flexible hinge 128 is at or near its minimum and the remainder of the flexible hinge is biased into the internal regions of the first portion 102.

These representative angular orientations illustrate that the combination of the flexible hinge 128 and the biasing assembly's compliant mechanism 126 ensure that the flexible hinge can accommodate rotation between the first and second portions 102 and 104 through a range of angular orientations. At each angular orientation, the biasing assembly 124 keeps the flexible hinge 128 under tension (e.g., biased inwardly) so that surplus portions of the flexible hinge are inside the first portion rather than being external to the first portion. This technical solution is further combined with a technical solution provided by the stability mechanism 134 and the retention mechanism 136 that enhances the operational integrity between the first portion 102 and the coupler 130 and between the coupler and the second portion 104 without increasing the thickness of the first portion as measured in the z-reference direction. Instead, the technical solutions allow a relatively thin first portion that feels robust and stable to the user and reduces/eliminates excess flexible hinge material that could otherwise obscure lower regions of the second portion and/or create a floppy overall device feel. The compliant mechanism also provides a technical solution of maintaining the same amount of flexible hinge material extending out of the first portion along the width of the flexible hinge.

An example implementation for the compliant mechanism and the flexible hinge is described in detail above relative to FIGS. 1A-5B. Note that other implementations of the compliant mechanism and the flexible hinge are contemplated.

FIGS. 6A-8C collectively illustrate several example biasing assemblies 124 and associated compliant mechanisms 126 relative to first portion 102 and flexible hinge 128.

Figure 6A:
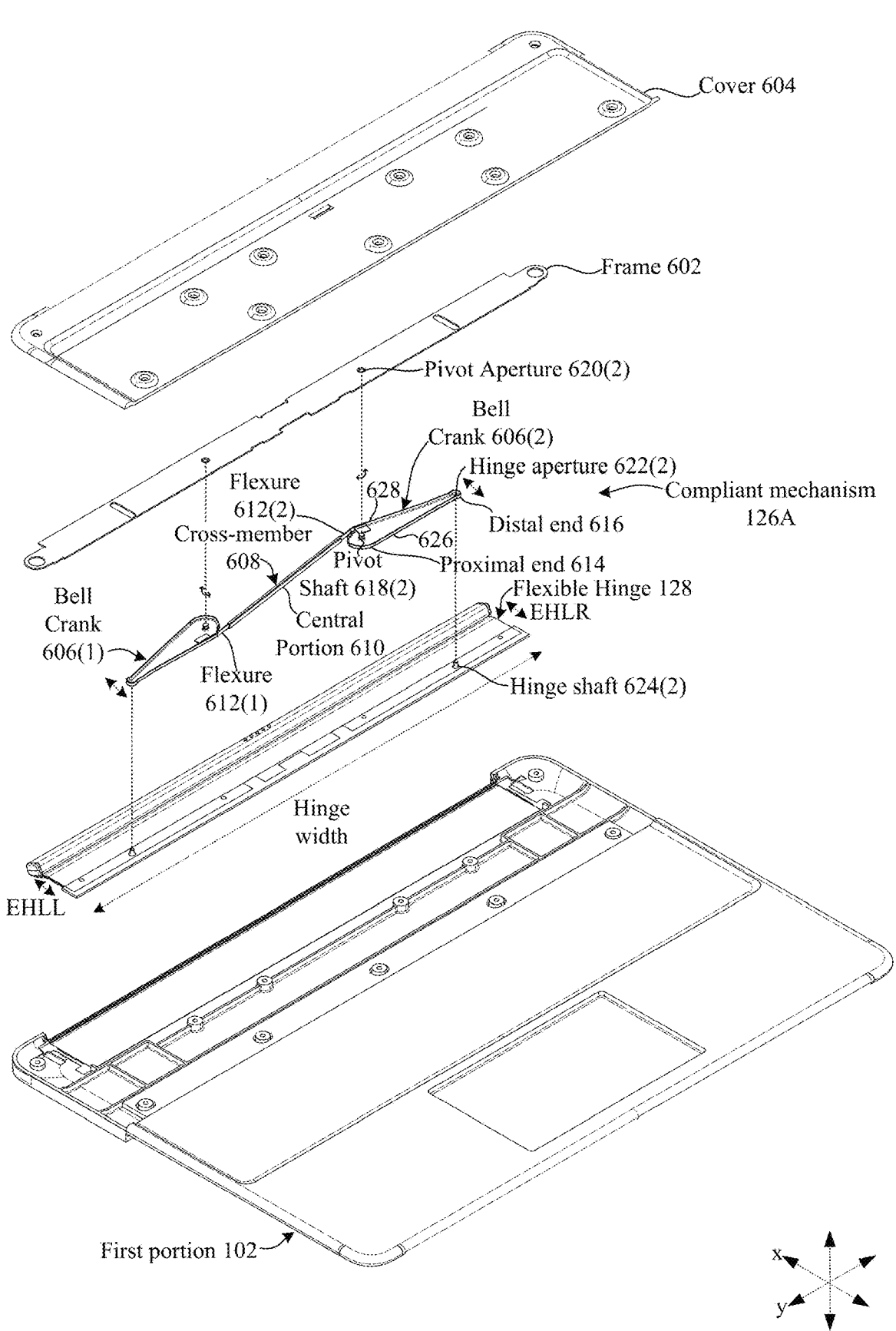
FIGS. 6A, 7A, and 8A show exploded perspective views of example devices in accordance with some implementations of the present concepts.
Figure 6B:
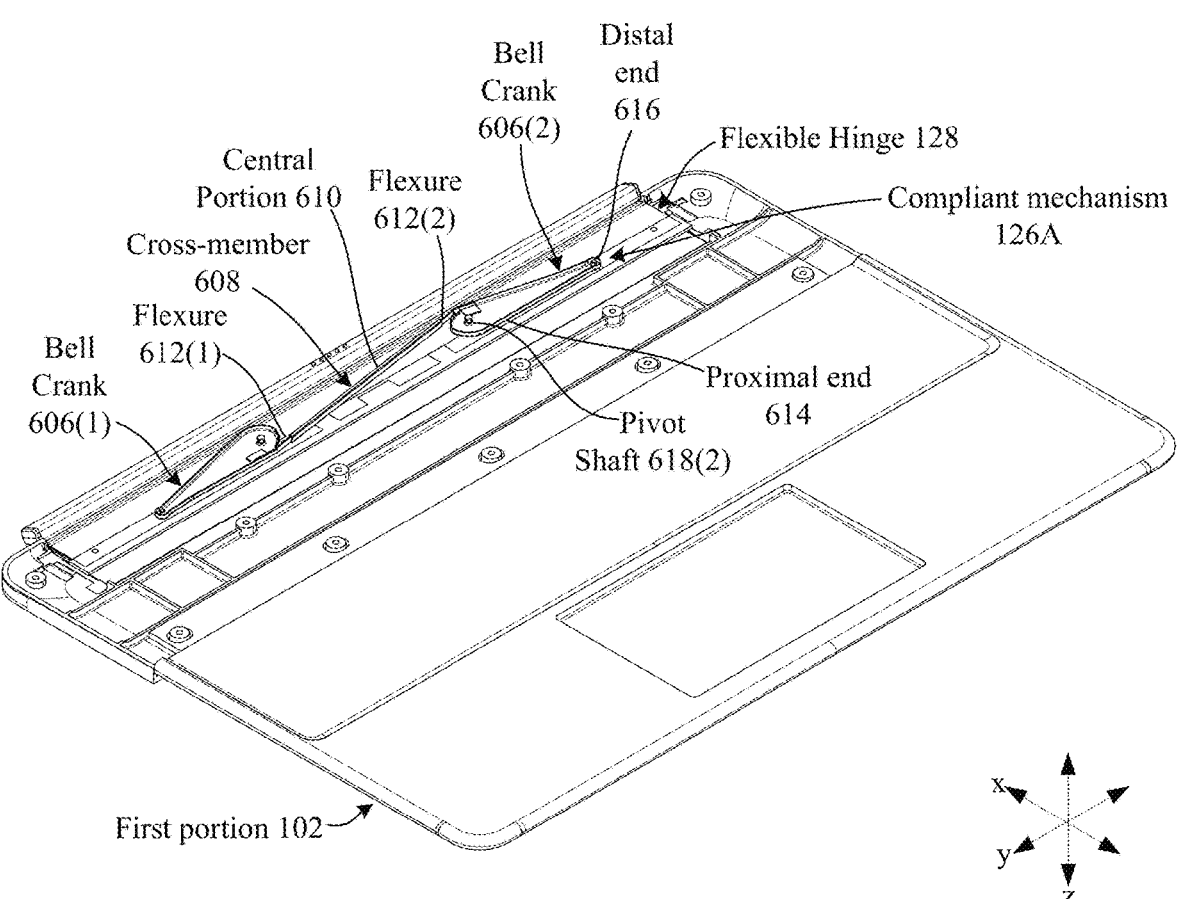
Figure 6C:
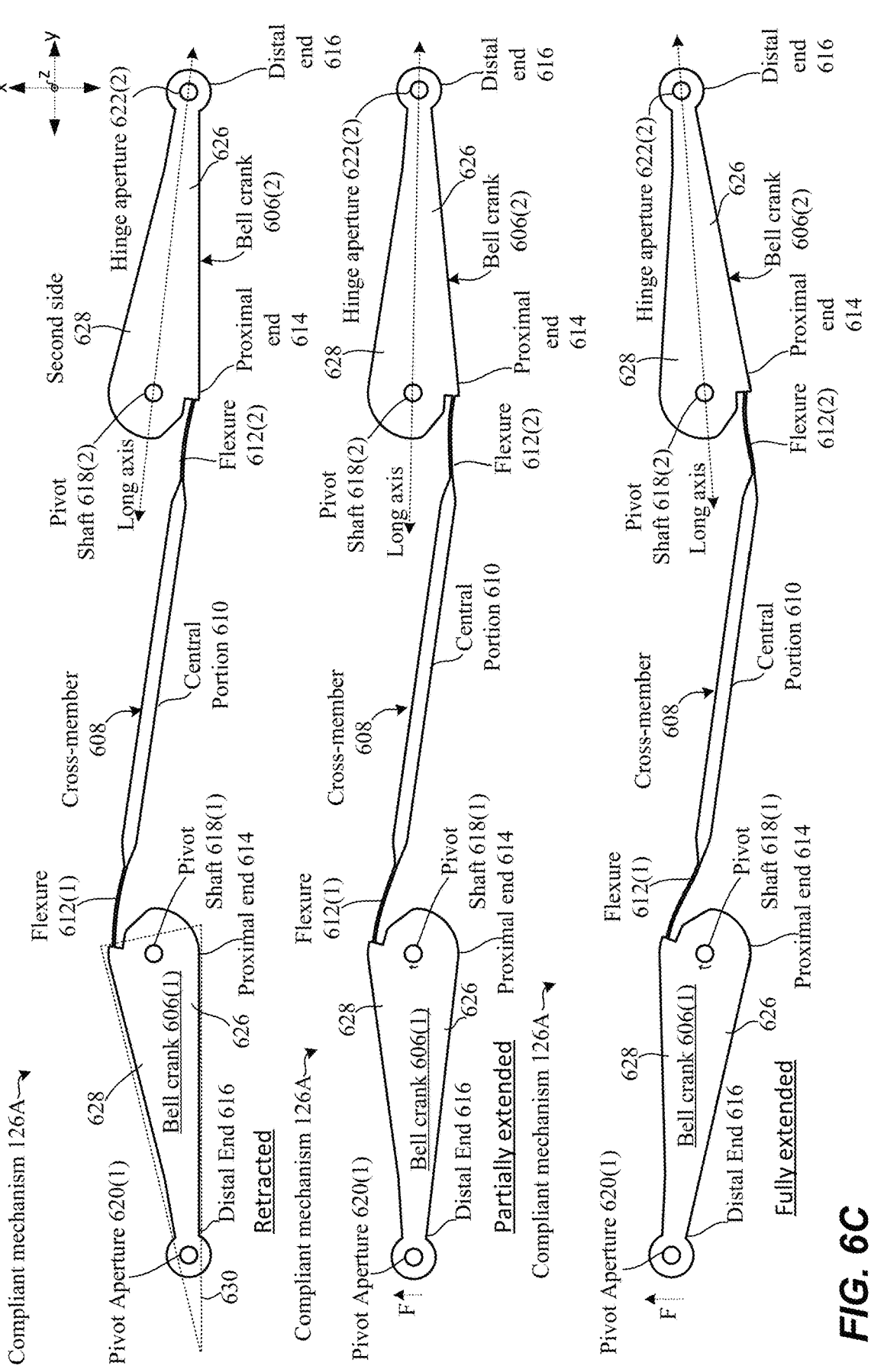

FIGS. 6A-6C collectively show the function of example compliant mechanism 126A as part of the biasing assembly 124. FIGS. 6A and 6B collectively show biasing assembly 124 in first portion 102 in exploded and partially assembled views, respectively. FIG. 6C shows the compliant mechanism 126A in isolation at retracted, partially extended, and fully extended orientations.

In this implementation, the first portion 102 includes a frame 602 and a cover 604. The compliant mechanism 126A is positioned between the flexible hinge 128 and the frame 602. In this case, the compliant mechanism 126A includes a pair of spaced-apart bell cranks 606 that are coupled by a cross-member 608. The cross-member 608 includes a central portion 610 interposed between flexures 612. The flexures 612 are secured to the bell cranks, such as by welding, brazing, and/or fasteners. Alternatively, the bell cranks 606 and cross-members 608 could be formed as a single piece, such as by machining, casting, or 3D printing.

In this implementation the central portion 610 is relatively stiffer or more rigid than the flexures 612. In turn, the flexures are resilient and easier to bend than the central portion. The relatively stiff central portion 610 provides a technical benefit of transferring force across the cross-member 608 from one bell crank to the other. The relatively flexible flexures 612 provide a technical benefit of bending as the bell cranks 606 rotate. The bending stores energy in the flexures as the force is transferred from one bell crank to the other.

The bell cranks 606 can extend from a proximal or flexure end 614 to a distal or flexible hinge end 616. The bell cranks 606 include pivot shafts 618 at the proximal ends 614 that engage pivot apertures 620 in the frame 602. Alternatively, the pivot shafts could be defined by the frame and the apertures defined by the bell cranks. The bell cranks 606 also include hinge apertures 622 that receive hinge shafts 624 from the flexible hinge 128. Alternatively, the hinge shafts could be defined by the bell cranks and the apertures defined by the flexible hinge. On FIG. 6A some of these elements only are labelled relative to bell crank 606(2) to avoid clutter on the drawing page.

The compliant mechanism 126A spans a majority of the width of the flexible hinge (e.g., hinge width on FIG. 6A). The compliant mechanism 126A is connected to the flexible hinge 128 towards the left and right sides (e.g., at the edges or spaced back from the edges). The compliant mechanism 126A is connected to the flexible hinge 128 via hinge apertures 622 in the distal ends 616 of the bell cranks 606 interacting with hinge shafts 624 of the flexible hinge 128.

The cross-member 608 connects to a first portion side 626 of one bell crank 606 and a second portion side 628 of the other bell crank 606. To clarify, as labelled on FIG. 6C relative to bell crank 606(2), a long axis extends through the bell cranks 606 and intersects the hinge aperture 622 and the pivot shaft 618. The first portion side 626 is on one side of the long axis facing the first portion 102 and the second portion side 628 is on the other side of the long axis facing the second portion 104.

The cross-member 608 synchronizes rotation of the two bell cranks around pivot shafts 618. In turn, the two bell cranks are synchronized in the extent of movement of their distal ends 616. The distal ends 616 are connected via hinge apertures 622 and hinge shafts 624 to the flexible hinge 128. Thus, the compliant mechanism ensures equal amounts or lengths of the flexible hinge 128 extend out of the first portion on the left and right sides. This movement is generally perpendicular to the first hinge end 108 (e.g., generally perpendicular to the y reference axis and parallel to the x reference axis). (As used here, generally perpendicular means within +/−10 degrees of perpendicular). This movement is represented by left extended hinge length (LEHL) and right extended hinge length (REHL) on FIG. 6A. These left and right lengths can change (e.g., more or less hinge length can extend out of the first portion) but remain equal to one another through the changes. Thus, the compliant mechanism 126A provides a technical solution of synchronizing the extent or length of hinge material extended from the first portion and reduces/eliminates skewing of the flexible hinge (e.g., more exposed hinge on one side than the other).

FIG. 6C shows the compliant mechanism 126A in isolation. The bell cranks 606 can approximate a portion of a triangle shape 630 (shown in ghost relative to bell crank 606(1) in the retracted orientation) that tapers from the proximal ends to the distal ends. In this implementation, the triangular shape is partially curved or rounded into a tear drop shape. The tear drop shape provides a technical solution that smoothly converts linear or arcuate movement of the distal ends to rotational movement around the proximal ends. Thus, pulling on one (first, such as left) side of the flexible hinge causes linear/arcuate movement of the adjacent distal end and rotation of the proximal end. This rotation is transferred by the cross-member to the other bell crank to produce rotation of the proximal end and ultimately arcuate or linear movement of the distal end on the second (right) side that is (substantially) equal to the movement induced on the first side. (As used here, substantially means with +/−5%).

Recall that the proximal ends 614 of the bell cranks 606 are stationary but can rotate relative to the first portion vias the pivot shafts 618. The distal ends 616 move along a linear or arcuate path with the flexible hinge via the hinge apertures 622. Thus, the compliant mechanism 126A provides a technical solution that converts linear movement of the flexible hinge that is received at the distal end 616 of an individual bell crank 606 to rotational movement of the proximal end 614 of the bell crank 606. This rotation is conveyed to the other bell crank 606 by the cross-member 608 to cause rotation of the proximal end 614 of the other bell crank 606. Rotation of the proximal end 614 of the other bell crank 606 creates linear (or slightly arcuate movement) of the distal end 616 of the other bell crank 606 which moves the connected flexible hinge 128 a corresponding and equal linear movement to the other side of the flexible hinge.

The retracted orientation shows the distal ends 616, and hence the flexible hinge (not shown), in their most-x reference direction position. This corresponds to the minimum amount of flexible hinge exposed (e.g., outside of) from the first portion. In this implementation, the configuration of the compliant mechanism (e.g., the attachment point of the flexures to the bell cranks) causes this retracted orientation to be a resting (e.g. low potential energy) state for the compliant mechanism 126. Thus, lacking an external force (F), the compliant mechanism maintains this orientation and creates a bias that pulls the flexible hinge into the first portion.

The partially extended orientation shows rotation of the proximal ends 614 of the bell cranks 606 around the pivot shafts 618 (e.g., clockwise for bell crank 606(1) and counterclockwise for bell crank 606(2)). Thus, the distal ends 616 that are connected to the flexible hinge have moved upward (in the +x reference direction). The distal ends 616 have moved the same distance and thus the flexible hinge material on the left and the right would move the same distance. The transition from the retracted orientation to the partially extended position could be caused by the user imparting a force (F) on the flexible hinge in the +x reference direction. This could occur by the user changing the relative orientation of the first and second portions and/or pulling the first and second portions apart, such as to detach them from one another.

Additional force in the +x reference direction will produce the fully extended orientation. This force is transferred through the cross-member 608. The cross-member's flexures 612 are made from a resilient material that can be flexed by the force. For instance, the force through the cross-member 608 may be a compressive force on the flexures 612. The flexing of the resilient material stores potential energy. When the force (F) is removed, the potential energy creates a responsive force in the opposite direction. This responsive force acts upon the bell cranks (e.g., counterclockwise for bell crank 606(1) and clockwise for bell crank 606(2)) This responsive force can move the distal ends 616 in the −x reference direction toward the retracted orientation.

FIGS. 7A-7D collectively show the function of another example compliant mechanism 126B as part of the biasing assembly 124. This implementation employs two cross-members 608 that are arranged in a crossing or x pattern with one positioned over (e.g., proud of) the other (e.g., in an opposite manner (first portion side of bell crank 606(1) to second portion side of bell crank 606(2) and first portion side of bell crank 606(2) to second portion side of bell crank 606(1)). This configuration maintains at least one of the cross-members in a tensioned state in both the retracted orientation and the extended orientations whether an external force is acting on the flexible hinge or not. As such, this implementation does not rely on a relatively stiff central portion of the cross-member to convey forces between the two bell cranks yet provides a technical solution in that one of the two cross-members will be under tension in any given scenario.

In the illustrated implementation, the two cross-members 608 cross each other in a stacked configuration with one over and one under. In this case, the cross-members have intersecting paths but are not secured together. Other implementations may secure the two cross-members, such as at a central pivot point similar to a pair of scissors. Still other implementations can utilize multiple cross-members, which do not have intersecting paths. For instance, the cross-members could run generally parallel to one another, among other configurations.

Figure 7A:
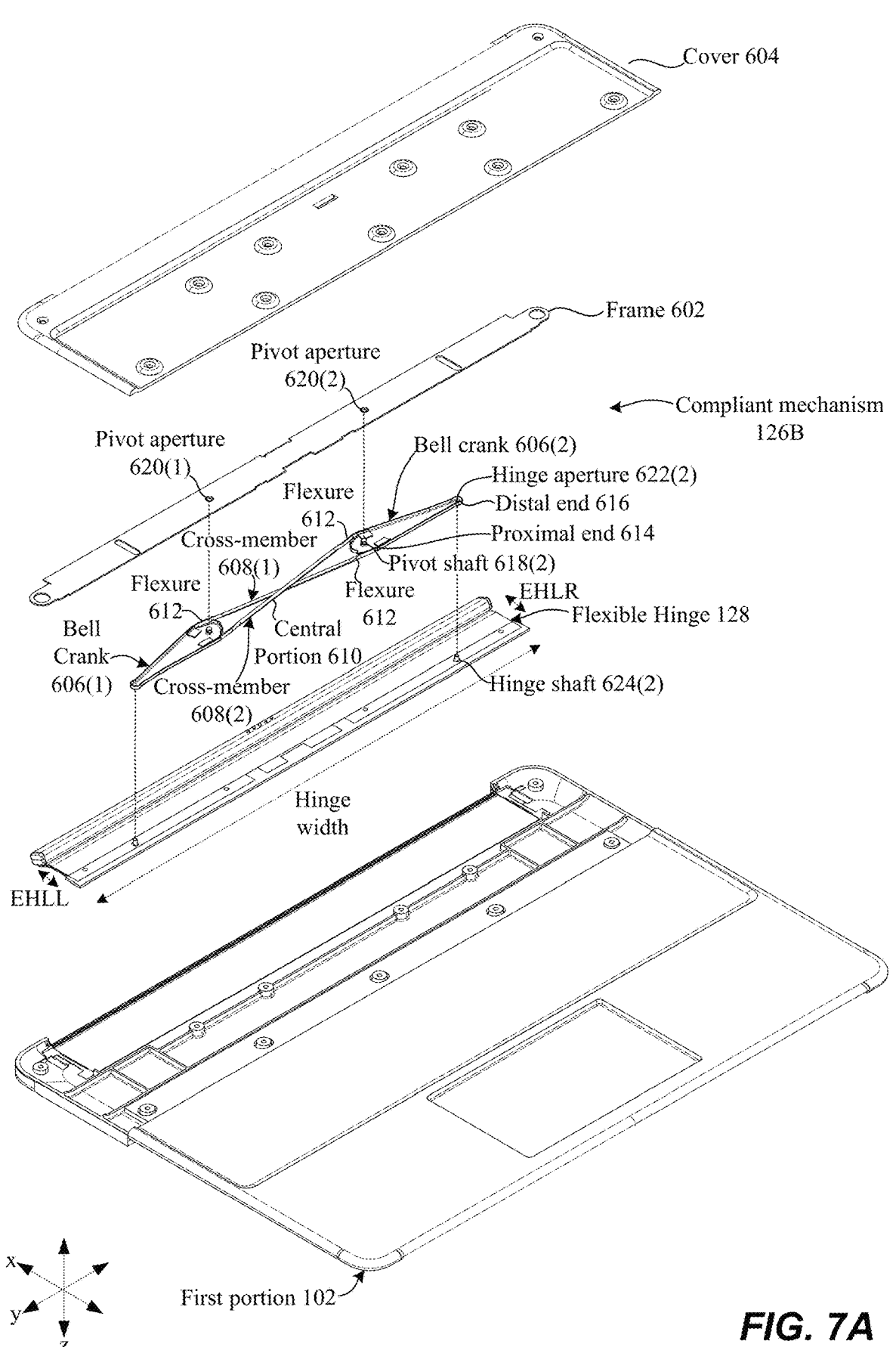
Figure 7B:
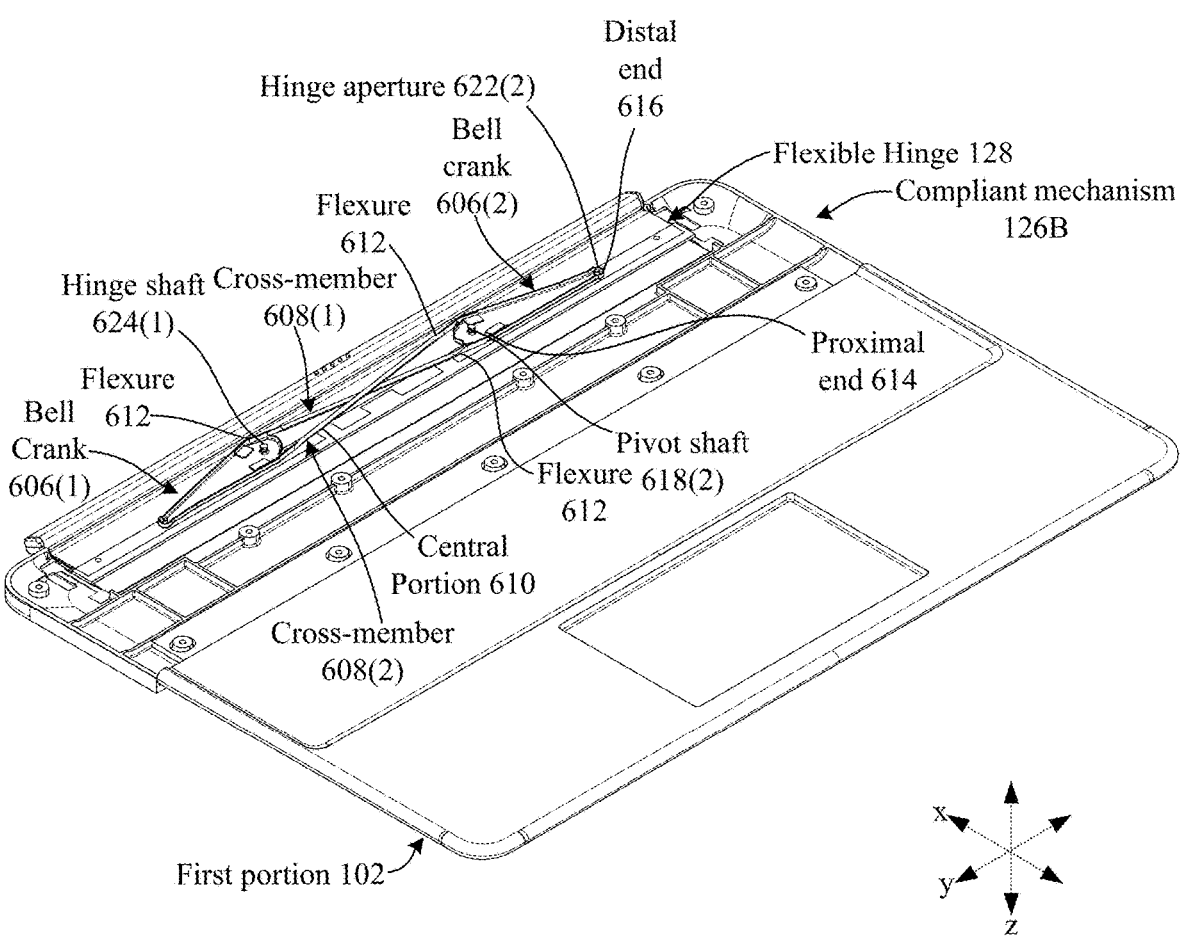
Figure 7C:
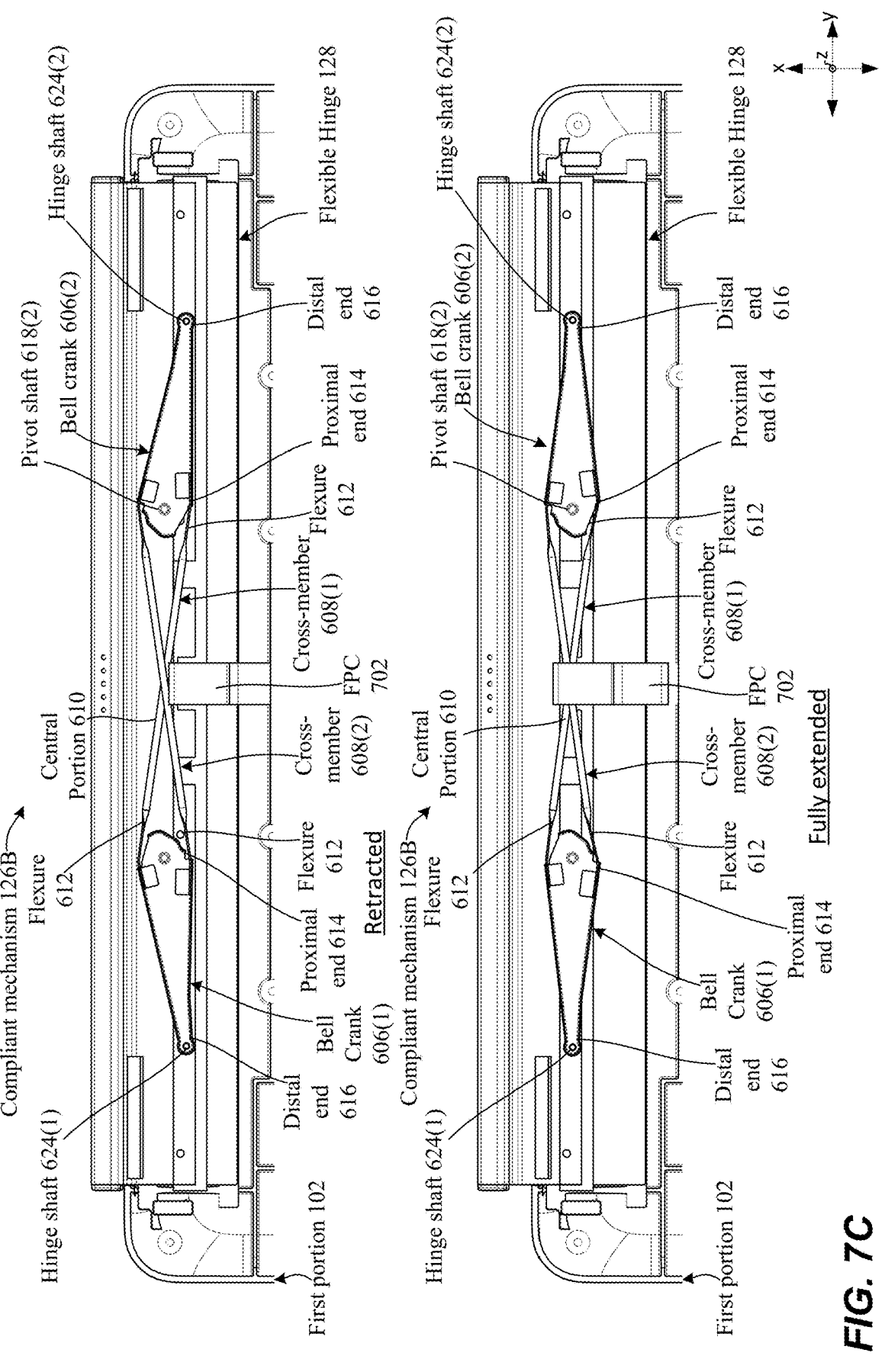

Note also that the compliant mechanism 126B is relatively thin in the z reference direction and as such provides a technical solution that allows room for other components, such as electrical components to pass over or under the compliant mechanism to span the first and second portions. For instance, FIG. 7C shows electrical components in the form of a flexible printed circuit (FPC) 702 passing over the cross-members 608.

Figure 7D:
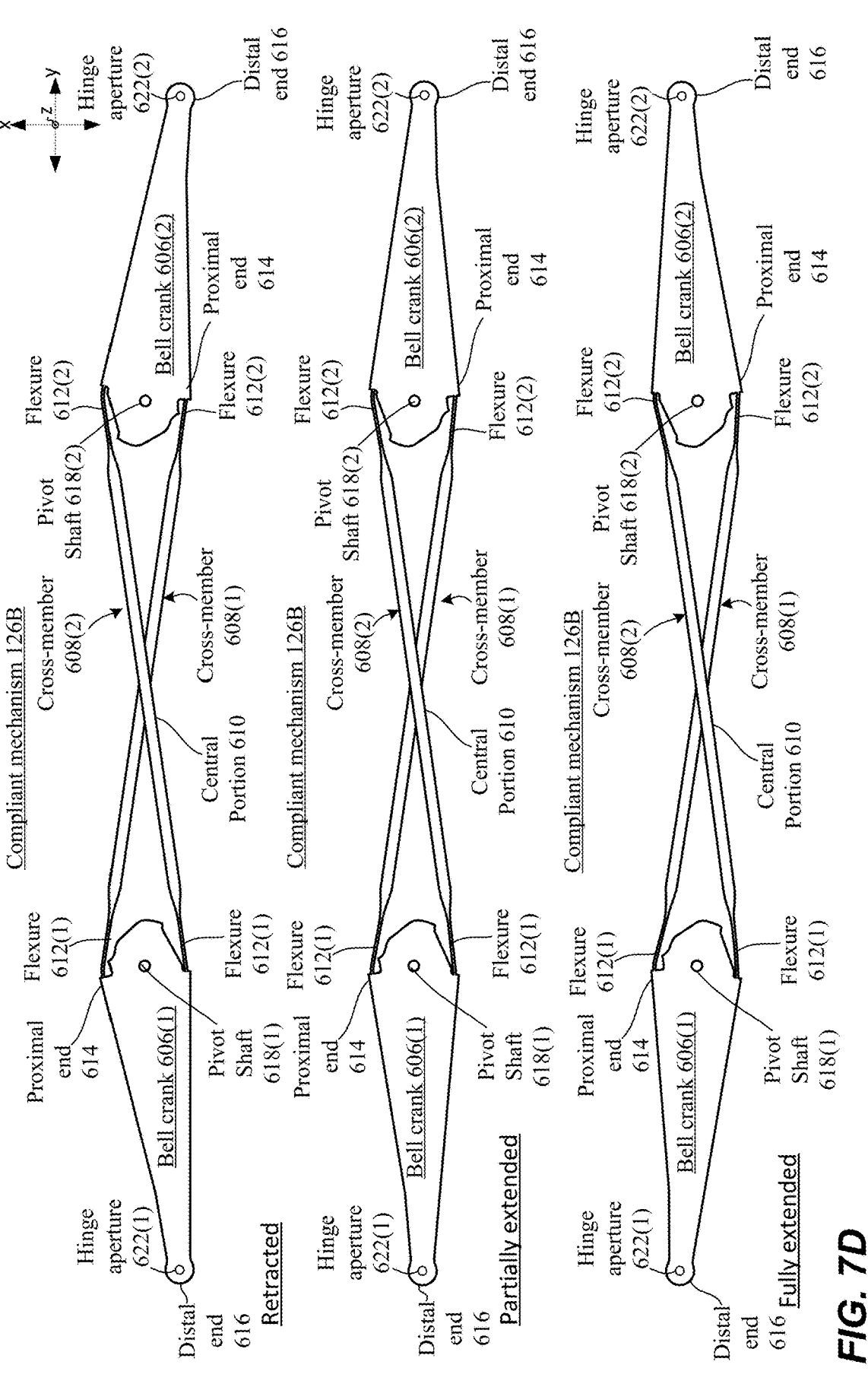

FIG. 7D shows the compliant mechanism 126B in retracted, partially extended, and fully extended orientations. The shape of the bell cranks 606 and the attachment points of the flexures 612 can be adjusted to cause the bell cranks to default to the retracted orientation unless exposed to external forces, such as the user pulling the flexible hinge in the +x reference direction. This external force can move the distal ends in the +x reference direction to the partially extended and fully extended orientations. Removal of the force allows the cross-members 608 to return the distal ends in the −x reference direction to the position shown in the retracted orientation.

Figure 8A:
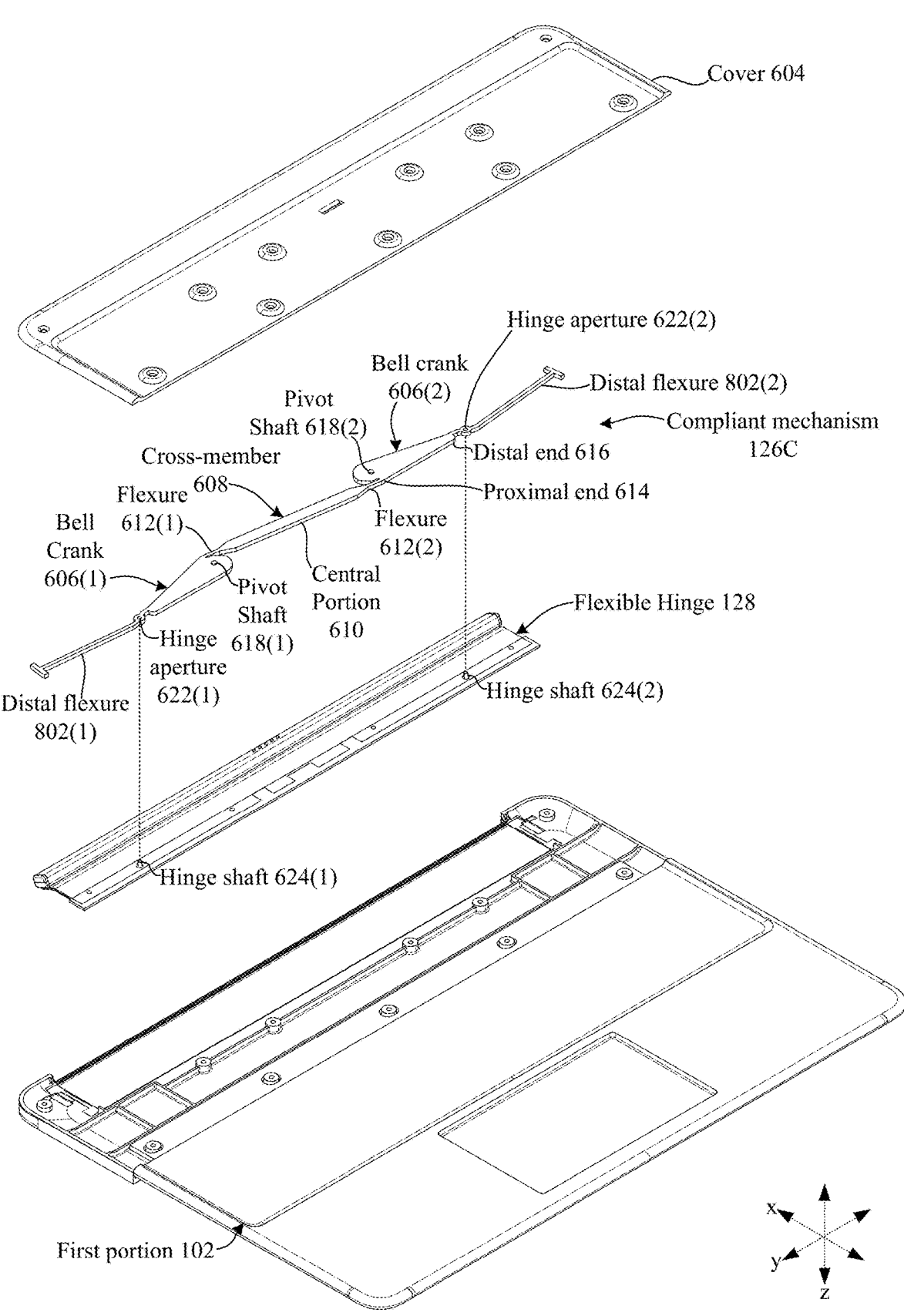
Figure 8B:
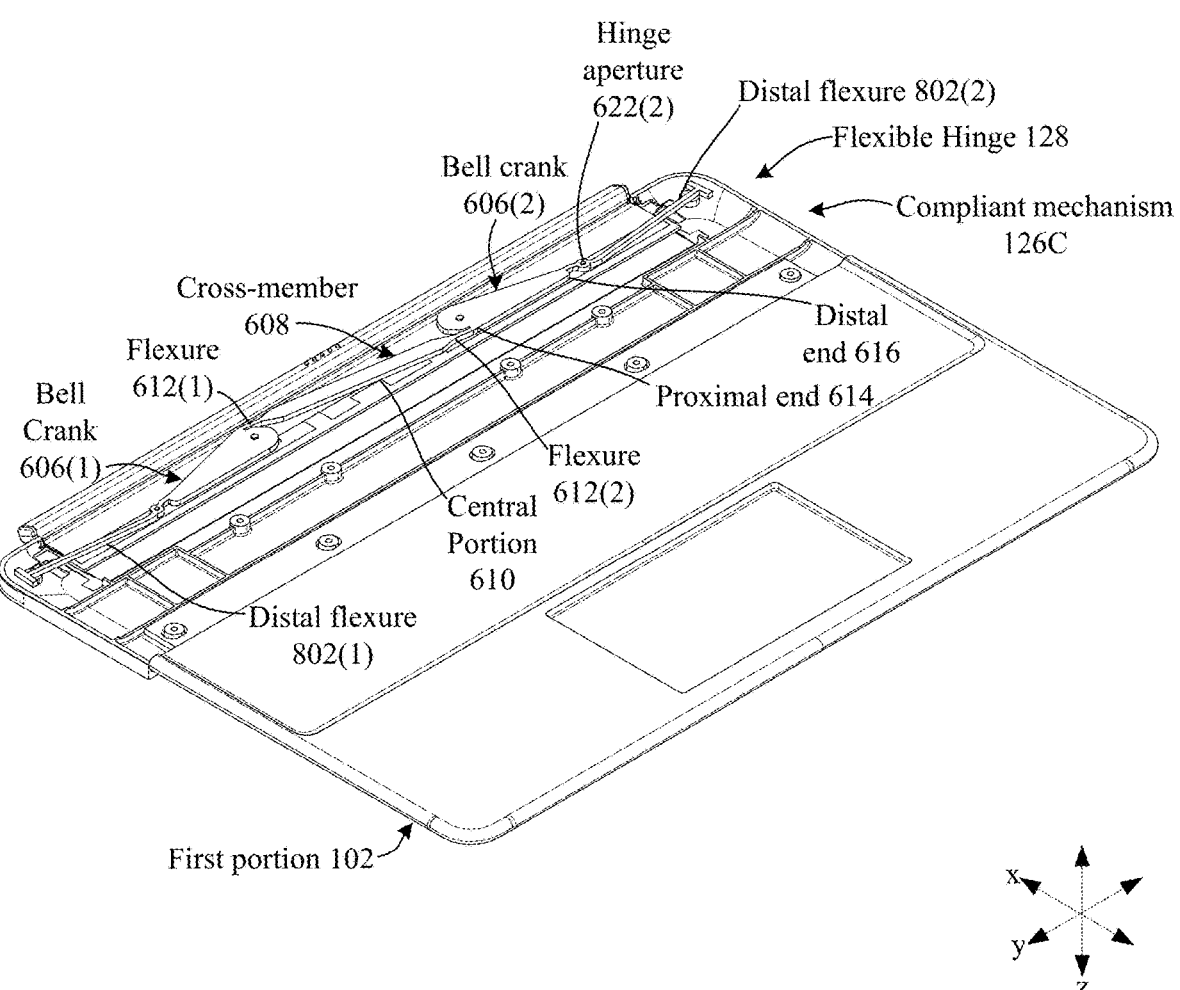
Figure 8C:
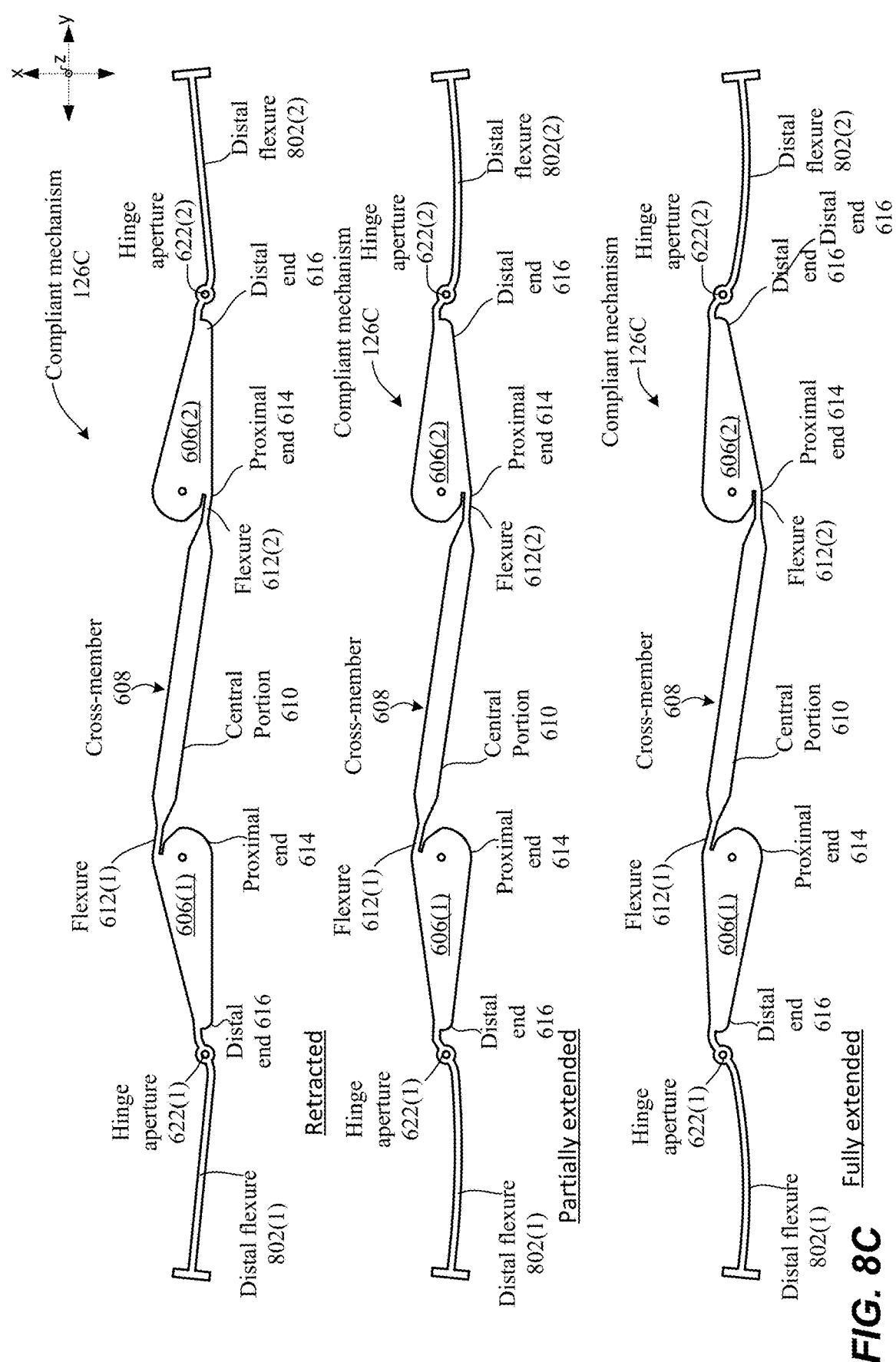

FIGS. 8A-8C collectively show another example compliant mechanism 126C as part of the biasing assembly 124. In this implementation the compliant mechanism 126C includes distal flexure 802. In this case, the distal flexures 802 extend between the distal ends 616 of the bell cranks 606 and the first portion 102. The pivot apertures 620 are formed in the distal flexures 802. The hinge apertures 622 receive hinge shafts 624 associated with the flexible hinge 128. The pivot shafts 618 engage apertures (not shown) in the underside of the cover 604. This engagement allows rotation of the proximal ends 614, while otherwise holding the proximal ends stationary in the x, y, and z reference directions.

FIG. 8C shows the compliant mechanism 126C in the retracted, partially extended, and fully extended orientations. In the retracted orientation, the compliant mechanism 126C is in a low energy state. This is reflected in the linear configuration of the distal flexures. The distal flexures provide a technical solution of spanning the device and storing energy while maintaining either a neutral configuration (e.g., retracted orientation) or tensioned configuration (e.g., extended orientation).

An external force in the +x reference direction loads distal flexures 802. In this case the force loading deforms the distal flexures 802. This is evidenced in the partially and fully extended orientations. For instance, in relation to distal flexure 802(1), the portion between the first portion and the hinge aperture 622(1) is bent downward relative to the linear configuration of the retracted orientation and the portion between the hinge aperture 622(1) and the bell crank 606(1) is deformed upward relative to the linear configuration of the retracted orientation. This aspect is shown in both of the partially and fully extended orientation, though the amplitude is greater in the fully extended orientation. This deformation stores potential energy in the compliant mechanism 126C that create a responsive force in the opposite direction to restore the compliant mechanism to the retracted orientation. Thus, when the external force is reduced or removed, the responsive force can return the compliant mechanism partially or fully to the retracted orientation and in turn pull the flexible hinge material back into the first portion (e.g., reduce the extent or length of exposed flexible hinge material). Thus, the compliant mechanism 126C provides a technical solution of both biasing the flexible hinge material into the first portion and maintaining equal amounts of exposed flexible hinge material on the left and right sides. This technical solution is achieved by bending and thus storing potential energy in the flexures 612 when the flexible hinge is extended. This flexing occurs while the compliant mechanism ensures equal movement on both sides of the flexible hinge. The potential energy provides a bias to retract the flexible hinge when the force is reduced or removed.

The device components described herein can be selected from and formed using materials and techniques employed in the art. The flexible hinge can include a material that can be selected based upon desired design properties for a given device implementation. For instance, a high fiber count woven fabric formed from high strength thread, such as Kevlar thread may be used in one implementation. High fiber count woven fabric can provide a technical solution of combining thinness with wear resistance while having desired bending/flexing properties. Another implementation may employ a polymer sheet, rather than a woven fabric, among other variations. The compliant mechanism can be formed from suitable materials, such as metals, polymers, and/or composites. The compliant mechanism can be formed utilizing various techniques, such as machining, additive formation (e.g., 3D printing), casting, molding, etc. The compliant mechanism can be formed from a single piece. Alternatively, the compliant mechanism can be formed from individual pieces that are secured together. For example, the cross-member could be a single piece. Alternatively, the central portion can be a separate piece that is secured to the flexures. That way, each piece can be selected to have desired properties (e.g., stiffness for the central portion and resiliency for the flexures). In turn, the flexures can be secured to the bell cranks, such as by pinning or welding, for example.

Further, while specific form factors are illustrated for purposes of explanation, the present concepts can be applied to other hinged computer form factors, such as notebook computers, tablets, smartphones, and/or other existing or yet to be developed form factors.

Although techniques, methods, devices, systems, etc., pertaining to compliant mechanism operating on flexible hinges are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a device comprising a first portion including first and second spaced-apart surfaces extending from a first hinge end to a first distal end, a second portion extending from a second hinge end to a second distal end, a flexible hinge positioned partially between the first and second surfaces and having a width defined between opposing sides that extends along a majority of the first hinge end, and a compliant mechanism positioned between the first and second surfaces and secured to the opposing sides of the flexible hinge and linear movement of the flexible hinge generally perpendicular to the first hinge end is configured to produce rotation of the compliant mechanism from a first orientation to a second orientation.

Another example can include any of the above and/or below examples where the compliant mechanism comprises a pair of bell cranks connected by a cross-member.

Another example can include any of the above and/or below examples where the cross-member extends from a first portion side of one bell crank to a second portion side of the other bell crank.

Another example can include any of the above and/or below examples where the cross-member comprises a relatively stiff central portion interposed between two flexures that are secured to the pair of bell cranks.

Another example can include any of the above and/or below examples where the device further comprises a second cross-member that is secured in an opposite manner to the cross-member to create an X shape.

Another example can include any of the above and/or below examples where the bell cranks are tapered from a proximal end to a distal end.

Another example can include any of the above and/or below examples where the bell cranks are tear drop shaped.

Another example can include any of the above and/or below examples where the flexures are coupled to proximal ends of the bell cranks.

Another example can include any of the above and/or below examples where the device further comprises distal flexures connected between the first portion and the distal ends of the bell cranks.

Another example can include any of the above and/or below examples where the proximal ends of the bell cranks rotate relative to the first portion and the distal ends move linearly or arcuately with the flexible hinge.

Another example can include any of the above and/or below examples where the linear movement of the flexible hinge out of the first portion generally perpendicular to the first hinge end is configured to cause the compliant mechanism to store potential energy and the linear movement of the flexible hinge into the first portion generally perpendicular to the first hinge end is configured to cause the compliant mechanism to release the stored potential energy with the rotation from the first orientation comprising a retracted orientation to the second orientation comprising an extended orientation.

Another example can include any of the above and/or below examples where the potential energy is stored by causing a portion of the compliant mechanism to bend during the rotation.

Another example can include a device comprising a first portion and a second portion, a compliant mechanism positioned in the first portion and comprising a pair of bell cranks coupled by a cross-member, and a flexible hinge having opposing sides of a first end secured to the pair of bell cranks and a second end secured to the second portion.

Another example can include any of the above and/or below examples where the compliant mechanism comprises the pair of bell cranks interconnected by a cross-member.

Another example can include any of the above and/or below examples where the cross-member synchronizes rotation of the pair of bell cranks.

Another example can include any of the above and/or below examples where the compliant mechanism further comprises a flexure.

Another example can include any of the above and/or below examples where the flexure comprises a portion of the cross-member.

Another example can include any of the above and/or below examples where the cross-member is connected to proximal ends of the bell cranks and the flexure comprises two distal flexures that are connected to distal ends of the bell cranks.

Another example can include a device comprising a first portion including a compliant mechanism, a second portion, and a flexible hinge secured between the second portion and the compliant mechanism, the compliant mechanism comprising a pair of bell cranks interconnected by a cross-member.

Another example can include any of the above and/or below examples where the bell cranks are configured to rotate with the first portion and move linearly or arcuately with the flexible hinge.

The invention claimed is:

1. A device, comprising:
   a first portion including first and second spaced-apart surfaces extending from a first hinge end to a first distal end;
   a second portion extending from a second hinge end to a second distal end;
   a flexible hinge positioned partially between the first and second surfaces and having a width defined between opposing sides that extends along a majority of the first hinge end; and,
   a pair of bell cranks positioned between the first and second surfaces and secured to the opposing sides of the flexible hinge and linear movement of the flexible hinge generally perpendicular to the first hinge end is configured to produce rotation of the pair of bell cranks from a first orientation to a second orientation.

2. The device of claim 1, wherein the pair of bell cranks are connected by a cross-member.

3. The device of claim 2, wherein the cross-member extends from a first portion side of one bell crank to a second portion side of the other bell crank.

4. The device of claim 3, wherein the cross-member comprises a relatively stiff central portion interposed between two flexures that are secured to the pair of bell cranks.

5. The device of claim 4, further comprising a second cross-member that is secured in an opposite manner to the cross-member to create an X shape.

6. The device of claim 3, wherein individual bell cranks are tapered from a proximal end to a distal end.

7. The device of claim 6, wherein the individual bell cranks are tear drop shaped.

8. The device of claim 4, wherein the flexures are coupled to proximal ends of the pair of bell cranks.

9. The device of claim 8, further comprising distal flexures connected between the first portion and the distal ends of the pair of bell cranks.

10. The device of claim 6, wherein the proximal ends of the pair of bell cranks rotate relative to the first portion and the distal ends move linearly or arcuately with the flexible hinge.

11. The device of claim 1, wherein the linear movement of the flexible hinge out of the first portion generally perpendicular to the first hinge end is configured to cause the pair of bell cranks to store potential energy and the linear movement of the flexible hinge into the first portion generally perpendicular to the first hinge end is associated with the pair of bell cranks releasing the stored potential energy.

12. The device of claim 11, wherein the pair of bell cranks are connected by a cross-member, and wherein the potential energy is stored by the pair of bell cranks bending the cross-member during the rotation.

13. A device, comprising:
   a first portion;
   a compliant mechanism positioned in the first portion and comprising a pair of bell cranks coupled by a cross-member; and,
   a flexible hinge having opposing sides of a first end secured to the pair of bell cranks and a second end secured to a coupler that is configured to removeably couple to a second portion.

14. The device of claim 13, further comprising another cross-member secured to the pair of bell cranks.

15. The device of claim 13, wherein the cross-member synchronizes rotation of the pair of bell cranks.

16. The device of claim 15, wherein the compliant mechanism further comprises a flexure.

17. The device of claim 16, wherein the flexure comprises a portion of the cross-member.

18. The device of claim 16, wherein the cross-member is connected to proximal ends of the bell cranks and the flexure comprises two distal flexures that are connected to distal ends of the bell cranks.

19. A device, comprising:
   a first portion including a compliant mechanism;
   a coupler configured to couple to a second portion; and,
   a flexible hinge secured between the coupler and the compliant mechanism, the compliant mechanism comprising a pair of bell cranks interconnected by a cross-member.

20. The device of claim 19, wherein the bell cranks are configured to rotate when the flexible hinge is moved relative to the first portion.

* * * * *